United States Patent
Hart

[11] Patent Number: 5,969,581
[45] Date of Patent: Oct. 19, 1999

[54] OPTO-ELECTRONICALLY CONTROLLED RF WAVEGUIDE

[75] Inventor: Stephen M. Hart, San Diego, Calif.

[73] Assignee: The United States of America as represented by the Secretary of the Navy, Washington, D.C.

[21] Appl. No.: 09/093,849

[22] Filed: May 28, 1998

[51] Int. Cl.[6] .................................. H01P 1/10; H01P 1/22
[52] U.S. Cl. ........................................ 333/81 B; 333/258
[58] Field of Search ................................ 333/101, 81 B, 333/258

[56] References Cited

U.S. PATENT DOCUMENTS

| | | | |
|---|---|---|---|
| 2,856,589 | 10/1958 | Kazan | 333/81 B |
| 3,465,266 | 9/1969 | Dixon, Jr. | 333/81 B |
| 4,295,058 | 10/1981 | Lade et al. . | |
| 4,801,822 | 1/1989 | Idaka et al. . | |
| 4,894,699 | 1/1990 | Hayashi et al. . | |
| 4,916,323 | 4/1990 | Hayashi et al. . | |
| 4,953,155 | 8/1990 | Tangonan et al. . | |
| 4,996,577 | 2/1991 | Kinzer . | |
| 5,045,680 | 9/1991 | Fan et al. . | |
| 5,057,694 | 10/1991 | Idaka et al. . | |
| 5,099,214 | 3/1992 | Rosen et al. | 333/81 B |
| 5,151,602 | 9/1992 | Idaka et al. . | |
| 5,159,295 | 10/1992 | Reits | 333/81 B |
| 5,162,935 | 11/1992 | Nelson . | |
| 5,191,459 | 3/1993 | Thompson et al. . | |
| 5,198,783 | 3/1993 | Jemison et al. . | |
| 5,229,665 | 7/1993 | Jemison et al. . | |
| 5,379,141 | 1/1995 | Thompson et al. . | |
| 5,384,282 | 1/1995 | Shiba et al. . | |
| 5,432,374 | 7/1995 | Norton . | |

*Primary Examiner*—Paul Gensler
*Attorney, Agent, or Firm*—Harvey Fendelman; Peter A. Lipovsky; Michael A. Kagan

[57] ABSTRACT

An opto-electronically controlled waveguide includes a waveguide; a finline mounted in the waveguide; a photovoltaic switch operably electrically connected to the finline; and a light source for generating an optical signal for modulating the photovoltaic switch. Modulation of the photovoltaic switch by intensity modulating the optical signal allows modulation of the insertion loss of the waveguide without the need for a DC bias.

17 Claims, 2 Drawing Sheets

OPTO-ELECTRONICALLY CONTROLLED RF WAVEGUIDE

BACKGROUND OF THE INVENTION

The present invention generally relates to the field of radio frequency (RF) waveguides, and more particularly to a waveguide in which is mounted a finline and a photovoltaic switch for modulating the impedance of the waveguide.

In the past, modulation of insertion losses of waveguides has been achieved by transitioning from a finline to microstrip using PiN diodes, followed by a transition back to finline. This configuration requires a DC bias to the PiN diodes. However, this approach has a limited bandwidth and is relatively difficult to manufacture. Therefore, a need exists for a way to modulate the insertion loss of a waveguide structure that does not require multiple transitions and the need for applying a DC bias to a transition element.

SUMMARY OF THE INVENTION

The present invention provides an opto-electronically controlled waveguide which includes a waveguide; a finline mounted in the waveguide; a photovoltaic switch electrically connected across the finline; and a light source for generating an optical signal for modulating the conductance of the photovoltaic switch. Modulation of the photovoltaic switch by intensity modulating the optical signal allows modulation of the insertion loss of the waveguide without the need for a DC bias. This and other advantages of the invention will become more apparent upon review of the accompanying figures and specification, including the claims.

BRIEF DESCRIPTION OF THE DRAWINGS

Throughout the several view, like elements are referenced using like references.

DESCRIPTION OF THE PREFERRED EMBODIMENT

Figure 1:
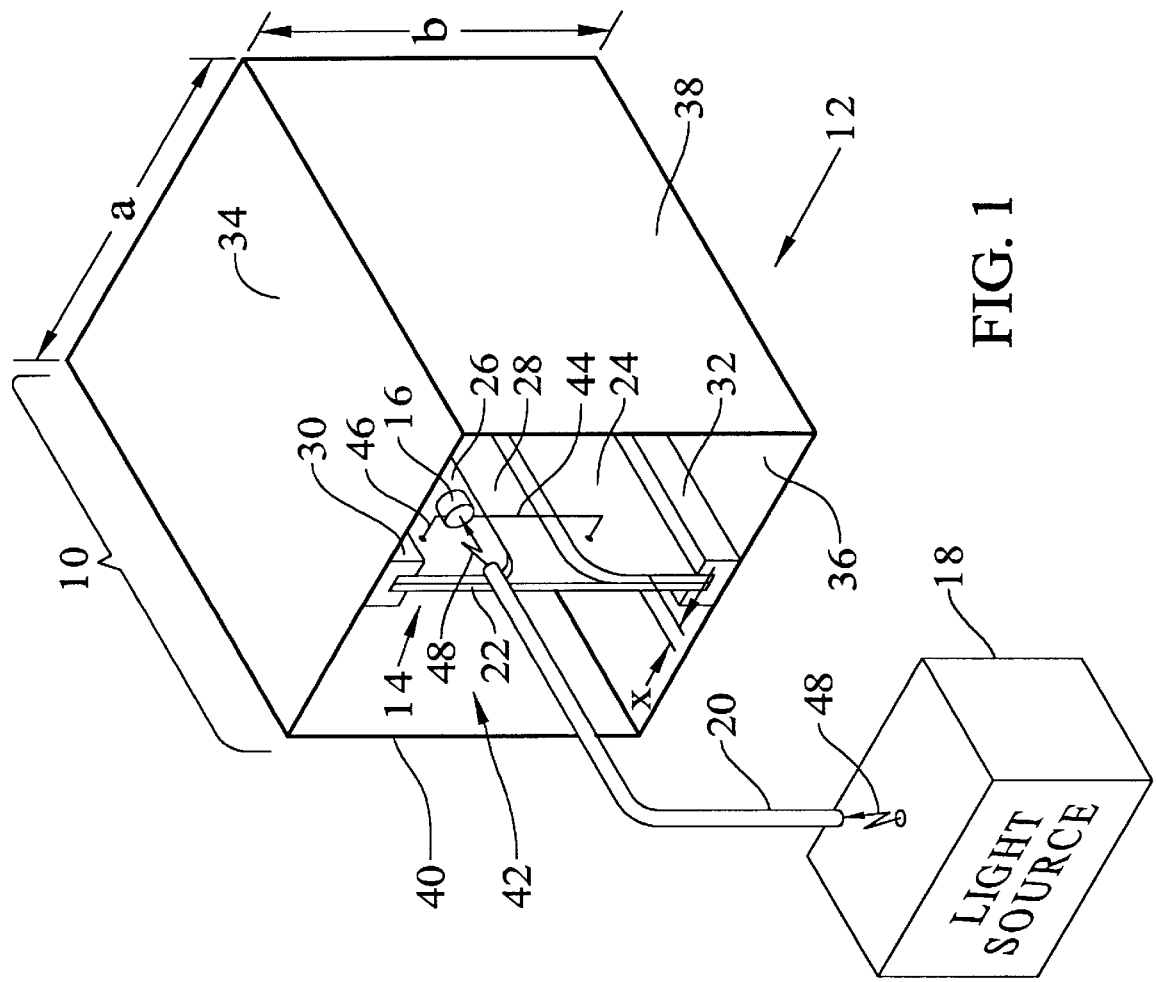
FIG. 1 shows a perspective view of an opto-electronically controlled RF waveguide embodying various features of the present invention.

Referring now to FIG. 1, there is shown an opto-electronically controlled RF waveguide 10 that may function as both an attenuator and as a switch. Opto-electronically controlled RF waveguide 10 includes a waveguide 12, finline 14, photovoltaic switch 16, light source 18, and optical fiber 20. The finline 14 includes a substrate 22 on which are fixed electrically conductive non-coterminous layers 24 and 26 so that a region 28 of substrate 22 is exposed between the layers 24 and 26. The waveguide 12 may include four walls 34, 36, 38, and 40 which define a generally rectangular waveguide channel 42. The finline 14 is fixedly mounted between channels 30 and 32 which are attached to opposite walls 34 and 36, respectively, of the waveguide 12. The longitudinal centers of the channels 30 and 32 preferably are centered about halfway between opposite walls 38 and 40 and generally run the full length of the waveguide 12.

The operating characteristics of waveguide 12 may be established to suit the needs of a particular application and may be generally described in accordance with the following equations:

$$b \approx \lambda_g/4; \quad \text{Eqn. (1)}$$

$$x << \lambda_g/10; \quad \text{Eqn. (2)}$$

$$f_c = v/\lambda_c = c/[\lambda_c(v_r \epsilon_r)^{1/2}]; \quad \text{Eqn. (3)}$$

$$\lambda_c = 1/[(M/2a)^2 + (N/2b)^2]; \text{ and} \quad \text{Eqn. (4)}$$

$$\lambda_g = \lambda/[1-(f_c/f)^2] \quad \text{Eqn. (5)}$$

where
$f_c$ represents the cutoff frequency of the waveguide;
$\lambda_c$ represents the cutoff wavelength;
$v$ represents the speed of light;
a and b are dimensions of the waveguide;
$v_r$ represents the permeability of material in the waveguide;
$\epsilon_r$ represents the permittivity of material in the waveguide;
M and N are independent integers greater than zero which define the mode;
$\lambda_g$ represents the operating wavelength of the waveguide, where $\lambda_g \neq \lambda_c$; and
x represents the thickness of the finline.

Photovoltaic switch 16 has two terminals 44 and 46 which are electrically coupled to electrically conductive layers 24 and 26, respectively, using for example, electrically conductive epoxy. Light source 18 generates optical signal 48 which is injected into and emitted from optical fiber 20 to illuminate and, thereby modulate, if desired, the conductance of photovoltaic switch 16. Modulation of photovoltaic switch 16 changes the impedance of the finline 14, and hence, the insertion loss of waveguide 12. Ideally, the insertion loss could be adjusted from nearly 0 to nearly infinity ohms. By way of example, light source 18 may be implemented, for example as a laser or light emitting diode such as a superluminescent diode or laser diode. Light source 18 may also be implemented as a flashlamp. Photovoltaic switch 16 may be a photovoltaic cell or photodiode controlled field effect transistor (PVFET), bipolar junction transistor (BJT), high electron mobility transistor (HEMT), heterojunction bipolar transistor (HBT), metal semiconductor transistor (MESFET), metal oxide semiconductor transistor (MOSFET), or the like. An important advantage of the invention is that no DC bias is required to control photovoltaic switch 16 (i.e., a "switching element") because the conductance of the photovoltaic switch 16 is modulated by changing the intensity of optical signal 48 generated by light source 18.

The substrate 22 of finline 14 may be implemented in one embodiment of the invention as a dielectric material such as alumina, sapphire, or quartz. Alternatively, the substrate 22 may consist essentially of semiconductor material such as silicon, germanium, gallium arsenide, and the like. The electrically conductive layers 24 and 26 may consist of electrically conductive material such as copper, aluminum, gold, and silver, and/or their alloys. The geometrical shapes of the conductive layers 24 and 26 are selected to achieve desired operating parameters of the waveguide 10.

Figure 2:
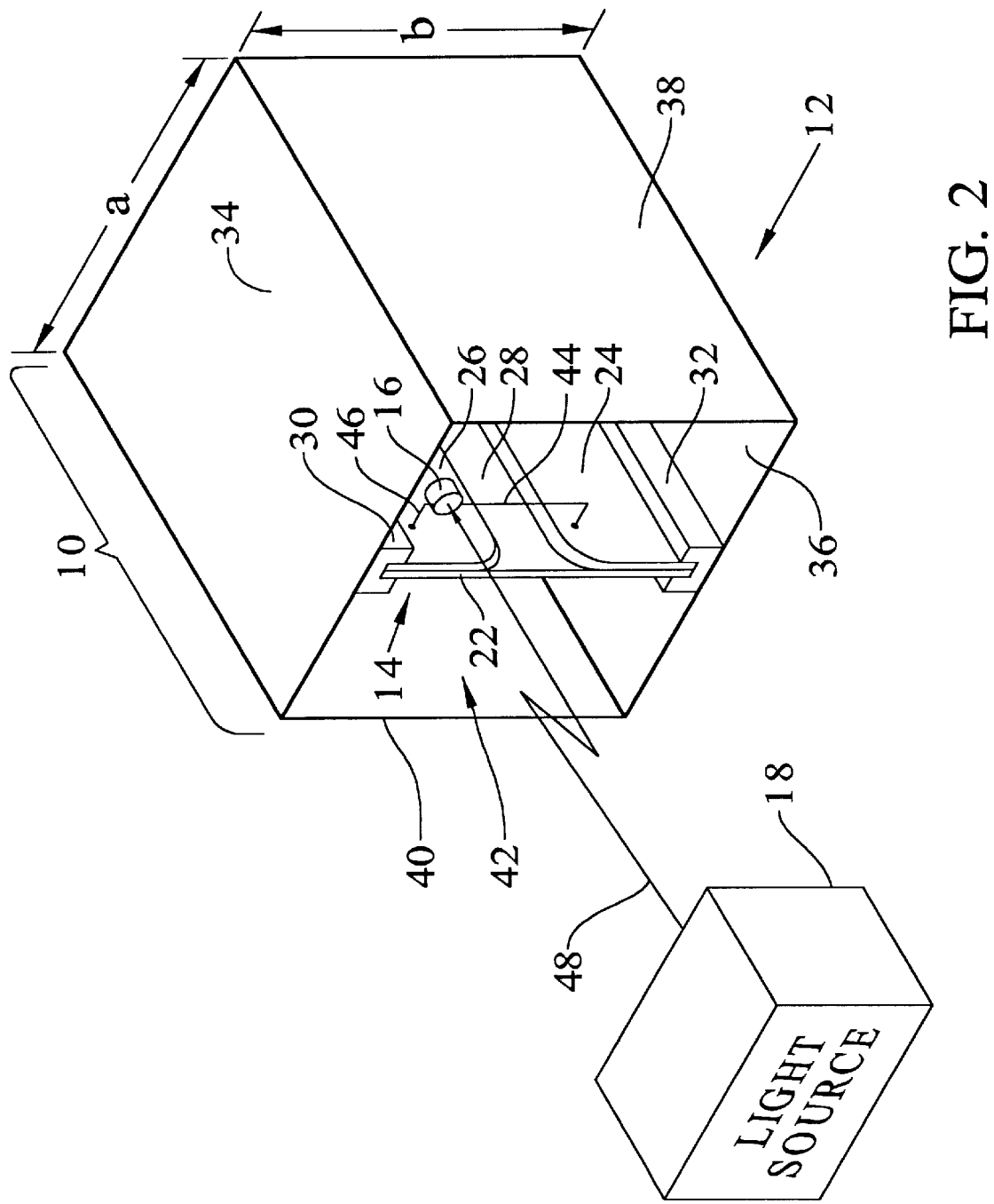
FIG. 2 shows a perspective view of another embodiment of an opto-electronically controlled RF waveguide wherein the light source is positioned to illuminate the photovoltaic switch directly without the need for an intermediary optical fiber.

In another embodiment of the present invention, shown in FIG. 2, light source 18 is positioned to directly illuminate the photovoltaic switch 16 with optical signal 48, thereby obviating the need for optical fiber 20.

Obviously, many modifications and variations of the present invention are possible in light of the above teachings. It is therefore to be understood that within the scope of the appended claims, the invention may be practiced otherwise than as specifically described.

I claim:

1. An opto-electronically controlled waveguide, comprising:
   a waveguide;
   a finline mounted in said waveguide;
   a photovoltaic switch operably connected to said finline; and
   a light source for irradiating said photovoltaic switch with an optical signal for modulating the insertion loss of said waveguide.

2. The opto-electronically controlled waveguide of claim 1 further including an optical fiber for directing said optical signal to said photovoltaic switch.

3. The opto-electronically controlled waveguide of claim 1 wherein said finline includes:
   a dielectric substrate; and first and second electrically conductive layers fixed to said dielectric substrate so that an area of said substrate is exposed between said first and second electrically conductive layers.

4. The opto-electronically controlled waveguide of claim 3 wherein said photovoltaic switch is selected from the group that includes a photovoltaic cell, photodiode controlled field effect transistor, bipolar junction transistor, high electron mobility transistor, heterojunction bipolar transistor, metal semiconductor transistor, and metal oxide semiconductor transistor.

5. The opto-electronically controlled waveguide of claim 3 wherein said photovoltaic switch has a first terminal electrically coupled to said first electrically conductive layer and a second terminal electrically coupled to said second electrically conductive layer.

6. The opto-electronically controlled waveguide of claim 3 wherein said dielectric substrate includes material selected from the group of aluminum oxide, sapphire, and quartz.

7. The opto-electronically controlled waveguide of claim 1 wherein said finline includes:
   a semiconducting substrate; and
   third and fourth electrically conductive layers fixed to said semiconducting substrate so that an area of said substrate is exposed between said third and fourth electrically conductive layers.

8. The opto-electronically controlled waveguide of claim 7 wherein said semiconducting substrate includes material selected from the group of silicon, gallium arsenide, and germanium.

9. The opto-electronically controlled waveguide of claim 7 wherein said third and fourth electrically conductive layers include material selected from the group of copper, aluminum, gold, silver.

10. The opto-electronically controlled waveguide of claim 1 wherein said light source is selected from the group that includes a light emitting diode, a laser, and a flashlamp.

11. The opto-electronically controlled waveguide of claim 10 wherein said light emitting diode is a laser diode.

12. The opto-electronically controlled waveguide of claim 10 wherein said light emitting diode is a superluminescent diode.

13. An opto-electronically controlled waveguide, comprising:
    a waveguide;
    a finline mounted in said waveguide, where said finline includes:
       a substrate; and
       first and second electrically conductive layers fixed to said substrate so that an area of said substrate is exposed between said first and second electrically conductive layers;
    a photovoltaic switch having a first terminal connected to said first electrically conductive layer and a second terminal connected to said second electrically layer; and
    a light source for irradiating said photovoltaic switch with an optical signal for modulating the insertion loss of said waveguide.

14. The opto-electronically controlled waveguide of claim 13 wherein said substrate is a dielectric material.

15. The opto-electronically controlled waveguide of claim 13 wherein said substrate is a semiconducting material.

16. The opto-electronically controlled waveguide of claim 13 wherein said photovoltaic switch is selected from the group that includes a photovoltaic cell, photodiode controlled field effect transistor, bipolar junction transistor, high electron mobility transistor, heterojunction bipolar transistor, metal semiconductor transistor, and metal oxide semiconductor transistor.

17. The opto-electronically controlled waveguide of claim 13 further including an optical fiber for directing said optical signal to illuminate said photovoltaic switch.

* * * * *